(12) United States Patent
Sumida

(10) Patent No.: US 6,770,539 B2
(45) Date of Patent: Aug. 3, 2004

(54) VERTICAL TYPE MOSFET AND MANUFACTURING METHOD THEREOF

(75) Inventor: Wataru Sumida, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/421,829

(22) Filed: Apr. 24, 2003

(65) Prior Publication Data

US 2003/0201483 A1 Oct. 30, 2003

(30) Foreign Application Priority Data

Apr. 30, 2002 (JP) ........................................ 2002-127830

(51) Int. Cl.[7] ........................ H01L 21/336; H01L 29/76
(52) U.S. Cl. ...................... 438/302; 257/328; 257/302; 257/334; 438/424
(58) Field of Search ................................. 257/328, 333, 257/302, 303, 334; 438/302, 424, 271

(56) References Cited

U.S. PATENT DOCUMENTS 5,366,914 A * 11/1994 Tashashi et al. ............ 257/328

FOREIGN PATENT DOCUMENTS

| JP | 10-223896 | 8/1998 |
| JP | 2000-260982 | 9/2000 |
| JP | 2001-119022 | 4/2001 |

OTHER PUBLICATIONS

T. Minato et al., "Which is cooler, Trench or Multi–Epitaxy?", (ISPSD 2000, May 22–25, Toulouse, France) pagers, 73–76.

T. Nitta et al., "Experimental Results and Simulation Analysis of 250V Super Trench Power MOSFET (STM)", (ISPSD 2000, May 22–25, Toulouse, France), pp. 77–80.

* cited by examiner

Primary Examiner—Long Pham
Assistant Examiner—Hoa B. Trinh
(74) Attorney, Agent, or Firm—Young & Thompson

(57) ABSTRACT

A vertical type MOSFET and a manufacturing method thereof, in which its drift resistance is made to be low by securing its breakdown voltage between source and drain electrodes of about 150 V being the middle class breakdown voltage and its manufacturing method is easy and its manufacturing cost is low, are provided. At a vertical type MOSFET, in which an N type high resistance drift layer is formed on an N type substrate and P type base layers are formed in designated regions of the surface of the high resistance drift layer and N type source layers are formed in the base layers and gate electrodes are formed on specified regions of the surface of the high resistance drift layer, a trench type back gate section is formed in a trench positioned at a region between the gate electrodes, by filling a insulation material in the trench.

9 Claims, 9 Drawing Sheets

(a)

(b)

(c)

(d)

(a)

(b)

(c)

(d)

VERTICAL TYPE MOSFET AND MANUFACTURING METHOD THEREOF

BACKGROUND OF THE INVENTION

The present invention relates to a vertical type MOSFET and a manufacturing method thereof, in particular, in which its drift resistance is made to be low without lowering the breakdown voltage between source and drain electrodes.

DESCRIPTION OF THE RELATED ART

FIG. 1 is a sectional view showing the structure of a conventional general use vertical type MOSFET. As shown in FIG. 1, at this vertical type MOSFET, an N⁻type epitaxial layer 202, which is a high resistance drift layer, is formed on one surface of an N⁺type semiconductor substrate 201. P type base layers 203 are formed in the surface of the N⁻type epitaxial layer 202, and N⁺type source layers 204 are formed in designated regions in the P type base layers 203 and a P⁺type base layer 205 is formed in a specified region of the P type base layers 203. Trenches 207 are formed in designated regions of the P type base layers 203 from the surface, and in each of the trenches 207, a gate insulation film 208 is formed and gate poly-silicon 209 is filled, and a trench type gate electrode 206 is formed. On a dielectric interlayer 210 covering the surface of the trench type gate electrodes 206, a source electrode 211, which is connected to the N⁺type source layers 204 and the P⁺type base layer 205, is formed. A drain electrode 212 is formed on the other surface of the N⁺type semiconductor substrate 201.

At this type of the vertical type MOSFET, in order to make the drift resistance low, it is desirable that the concentration of the impurity in the N⁻type epitaxial layer 202 (high resistance drift layer) is set to be high. However, when a voltage is applied between the source electrode 211 and the drain electrode 212, a depletion layer occurs only in the vertical direction between the P type base layer 203 and the high resistance drift layer 202. Therefore, the electric field strength exceeds the critical electric field during extending the depletion layer, and the electric field centralization, which is one of the causes of lowering the breakdown voltage between the source electrode 211 and the drain electrode 212, is liable to occur. Consequently; in order to secure a certain value of the breakdown voltage between the source electrode 211 and the drain electrode 212, there is a problem that the concentration of the impurity in the high resistance drift layer 202 cannot be made to be a value being more than a specified value.

In order to solve this problem, there are conventional vertical type MOSFETs in which the drift resistance is lowered and the breakdown voltage between the source electrode and the drain electrode is made to be high. For example, as a first conventional technology, Japanese Patent Application Laid-Open No. 2001-119022 discloses a semiconductor device and a manufacturing method thereof. FIG. 2 is a sectional view showing the structure of the vertical type MOSFET at the first conventional technology. In FIG. 2, each of the parts being equivalent to one of the parts shown in FIG. 1 has the same reference number, therefore the same explanation is omitted. This vertical type MOSFET has planar type gate electrodes and the gate electrodes are not the trench type gate electrodes.

As shown in FIG. 2, plural P⁻type layers 213 are layered in the high resistance drift layer 202 at the positions right under the P type base layer 203 in the vertical direction (in the depth direction). That is, PN junctions being in parallel to the high resistance drift layer 202 are formed. By this structure, at the time when a voltage is applied between the source electrode 211 and the drain electrode 212 in a state that the vertical type MOSFET is off, a depletion layer occurs not only in the vertical direction between the P type base layer 203 and the high resistance drift layer 202 but also in the horizontal direction between the plural P⁻type layers 213 and the high resistance drift layer 202. With this structure, compared with a vertical type MOSFET in which the plural P⁻type layers 213 are not formed, the concentration of the impurity in the high resistance drift layer 202 can be set to be high even at the same breakdown voltage, and the drift resistance can be lowered. And with this structure, a vertical type MOSFET whose breakdown voltage is larger than 500V can be obtained.

As a second conventional technology, Japanese Patent Application Laid-Open No. 2000-260982 discloses a semiconductor device and a manufacturing method thereof. FIG. 3 is a sectional view showing the structure of the vertical type MOSFET at the second conventional technology. In FIG. 3, each of the parts being equivalent to one of the parts shown in FIG. 1 has the same reference number, therefore the same explanation is omitted. This vertical type MOSFET has planar type gate electrodes and the gate electrodes 206 are not the trench type gate electrodes.

As shown in FIG. 3, a trench 214 is formed in the N⁻type epitaxial layer 202 being the high resistance drift layer in the vertical direction, and a P⁻type epitaxial layer 215, which connects to the P type base layer 203, is grown in the trench 214. With this, a PN junction being in parallel to the high resistance drift layer 202 is formed. By this structure, at the second conventional technology, as the same as at the first conventional technology, the concentration of the impurity in the high resistance drift layer 202 can be set to be high and the drift resistance can be lowered by securing a certain value of the breakdown voltage.

However, at the first conventional technology, each of the plural P⁻type layers 213 is continuously formed in the thickness direction of the high resistance drift layer 202. In order to form this, after a thin N⁻type epitaxial layer 202 was grown, a P type impurity is implanted in this thin N⁻type epitaxial layer 202, and this process is repeated in plural times and each of the plural P⁻type layers 213 is formed in each of the plural thin N⁻type epitaxial layers 202. That is, a layered structure is required. After this, the P type impurity is activated by a thermal process, and the high resistance drift layer 202 having a certain thickness is formed. Consequently, the plural P⁻type layers 213 can be formed in the vertical direction in a long and deep state, however, there are problems that the number of the processes becomes large and the cost becomes high.

At the second conventional technology, etching for the trench 214 is executed selectively from the surface of the N⁻type epitaxial layer 202, and the P⁻type epitaxial layer 215 is grown in the trench 214 and embedded. Therefore, technologies to form the deep trench by etching and to grown the epitaxial layer selectively have some difficulties, consequently there is a problem that the cost becomes high.

SUMMARY OF THE INVENTION

It is therefore an object of the present invention to provide a vertical type MOSFET and a manufacturing method thereof, in particular, in which its drift resistance is made to be low by securing its breakdown voltage between source and drain electrodes of about 150 V being the middle class breakdown voltage and its manufacturing method is easy and its manufacturing cost is low.

According to a first aspect of the present invention, for achieving the object mentioned above, there is provided a vertical type MOSFET. The vertical type MOSFET provides a high resistance drift layer being a conductivity type on a substrate being a conductivity type and base layers being an opposite conductivity type in designated regions of the surface of the high resistance drift layer and source layers being a conductivity type in the base layers and gate electrodes on specified regions of the surface of the high resistance drift layer. Further the vertical type MOSFET provides a trench type back gate section, which was formed in a first trench positioned at a region between the gate electrodes by filling an insulation material in the first trench, and an impurity layer being an opposite conductivity type, which was formed in the high resistance drift layer at a region right under the trench type back gate section.

According to a second aspect of the present invention, in the first aspect, the impurity layer being the opposite conductivity type consists of plural impurity layers that are positioned in different depths and are connected in the depth direction.

According to a third aspect of the present invention, in the first aspect, the impurity layer being the opposite conductivity type consists of plural impurity layers that are positioned in different depths and are separated in the depth direction.

According to a fourth aspect of the present invention, in the first aspect, each of the gate electrodes is a trench type gate electrode in which a gate insulation film was formed on a second trench formed through one of the source layers and one of the base layers and a conductivity material was filled in the second trench on the gate insulation film.

According to a fifth aspect of the present invention, in the first aspect, each of the gate electrodes is a planar type gate electrode in which a gate insulation film was formed on one of the source layers and a part of one of the base layers and a part of the high resistance drift layer and a conductivity material was formed on the gate insulation film.

According to a sixth aspect of the present invention, in the first aspect, a dielectric interlayer is formed on the source layers and the gate electrodes and the trench type back gate section, and a source electrode connecting to one of the source layers and one of the base layers is formed through a contact hole opened in the dielectric interlayer.

According to a seventh aspect of the present invention, in the sixth aspect, a conductive material being different from a conductive material of the source electrode is filled in the contact hole.

According to an eighth aspect of the present invention, for achieving the object mentioned above, there is provided a manufacturing method of a vertical type MOSFET. The manufacturing method of the vertical type MOSFET provides the steps of, forming a high resistance drift layer being a conductivity type on a substrate being a conductivity type, forming base layers being an opposite conductivity type in designated regions of the surface of the high resistance drift layer, forming source layers being a conductivity type in the base layers, forming gate electrodes in specified regions of the source layers and the base layers reaching to the high resistance drift layer via an insulation film. Further, the manufacturing method of the vertical type MOSFET provides the steps of, forming a trench at a designated position between the gate electrodes in the high resistance drift layer, forming impurity layers being an opposite conductivity type in the high resistance drift layer at the right under position of the trench by implanting ions of an impurity being an opposite conductivity type from the bottom of the trench, and filling an insulation material in the trench.

According to a ninth aspect of the present invention, in the eighth aspect, each of the impurity layers is formed in respective different depth in the high resistance drift layer by plural ion implantation.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
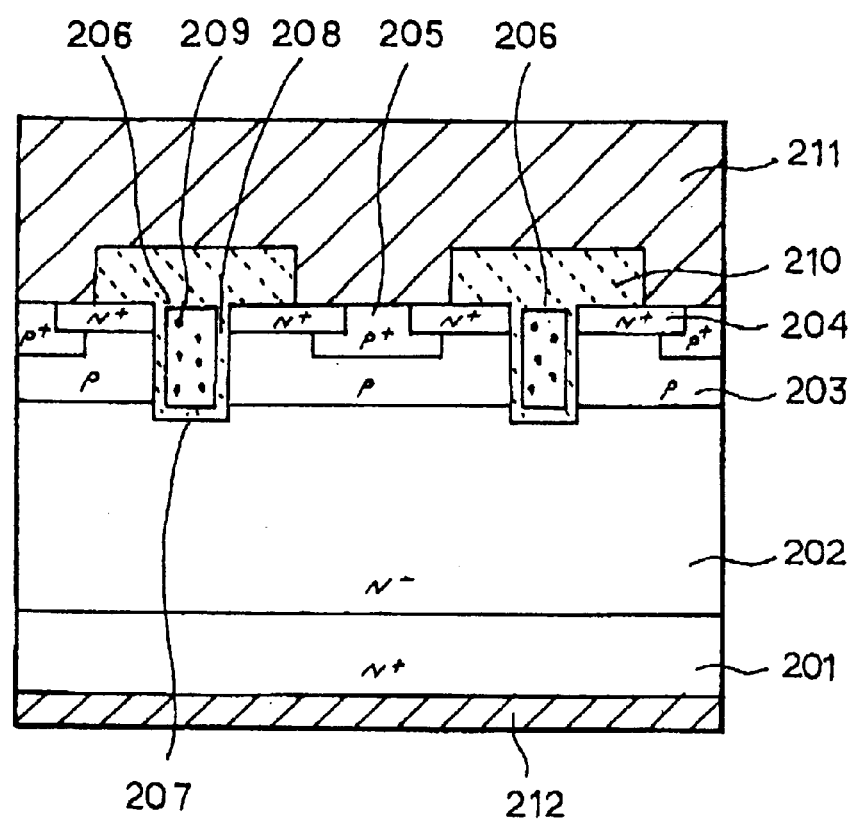
FIG. 1 is a sectional view showing the structure of a conventional general use vertical type MOSFET.
Figure 2:
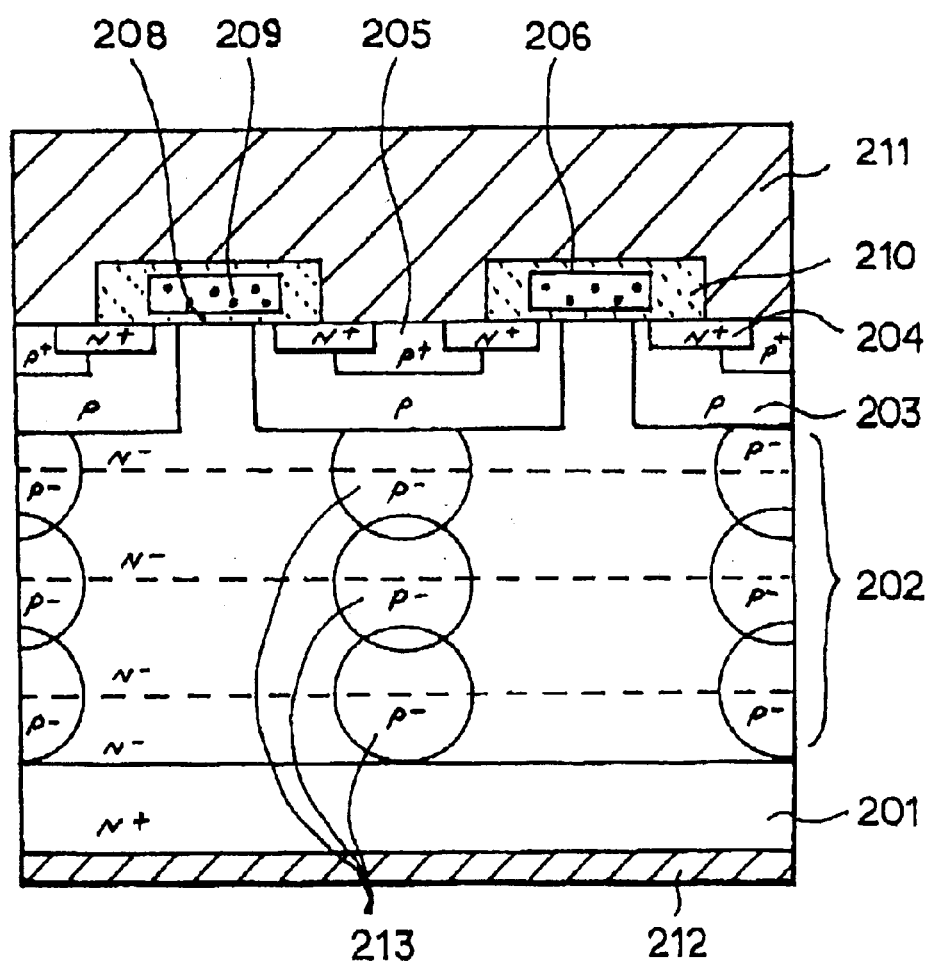
FIG. 2 is a sectional view showing the structure of the vertical type MOSFET at the Japanese Patent Application Laid-Open No. 2001-119022.
Figure 3:
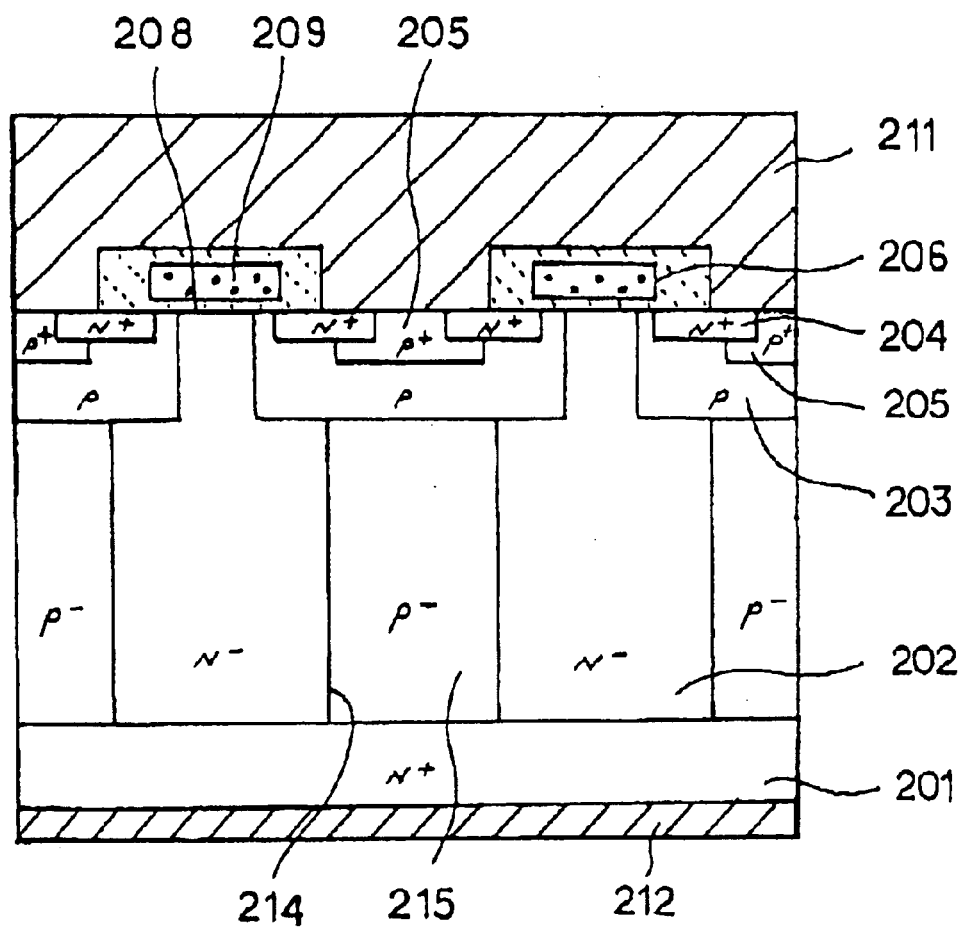
FIG. 3 is a sectional view showing the structure of the vertical type MOSFET at the Japanese Patent Application Laid-Open No. 2000-260982.
Figure 4:
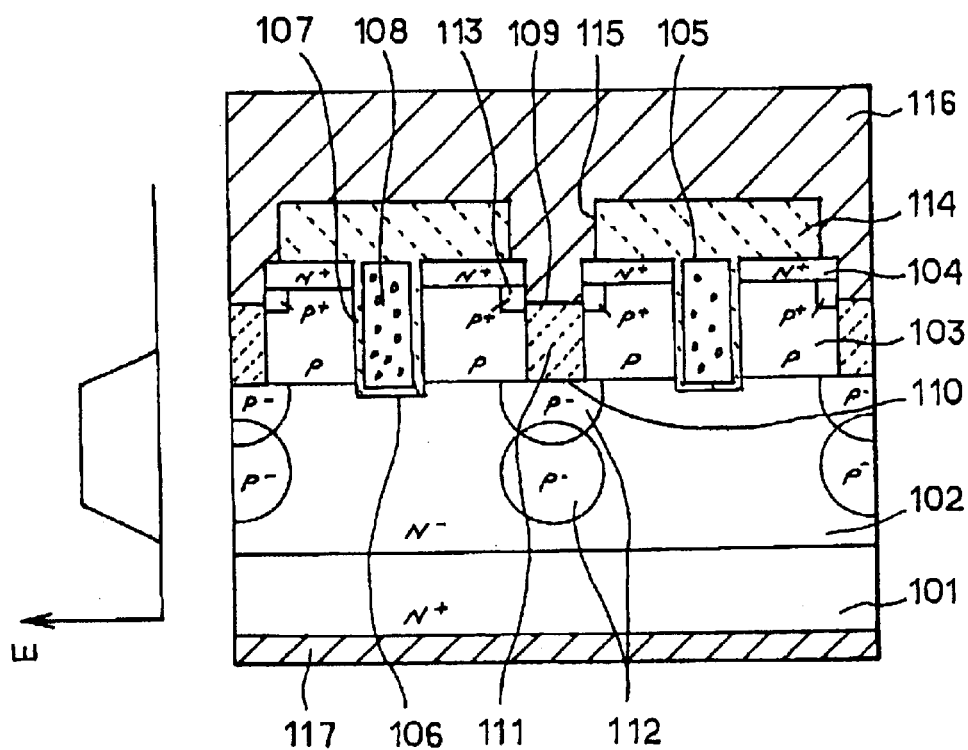
FIG. 4 is a sectional view showing the structure of a vertical type MOSFET at a first embodiment of the present invention.

Referring now to the drawings, embodiments of the present invention are explained in detail. FIG. 4 is a sectional view showing the structure of a vertical type MOSFET at a first embodiment of the present invention.

As shown in FIG. 4, an N⁻type epitaxial layer 102 being a high resistance drift layer is formed on one surface of an N⁺type semiconductor substrate 101 being a low resistance drift layer. The concentration of the N type impurity in the N⁺type semiconductor substrate 101 is, for example, $2E19/cm^3$, and the concentration of the N type impurity in the N⁻type epitaxial layer 102 is, for example, $3E15/cm^3$. P type base layers 103 and N⁺type source layers 104 are layered in the N⁻type epitaxial layer 102. The concentration of the P type impurity in each of the P type base layers 103 is, for example, $1E17/cm^3$, and the concentration of the N type impurity in each of the N⁺type source layers 104 is, for example, $1E20/cm^3$. Each of trench type gate electrodes 105 is formed from the surface of each of the N⁺type source layers 104 to the N⁻type epitaxial layer 102. A gate insulation film 107 being such as an oxide film is formed inside surface of a second trench 106 and a gate poly-silicon 108 having conductivity is filled in the second trench 106 having the gate insulation film 107, and each of the trench type gate electrodes 105 is formed.

In FIG. 4, plural trench type gate electrodes 105 are disposed in a parallel state, therefore, in the region between the plural trench type gate electrodes 105, a trench type back gate section 109 is formed from the position being deeper than the surface of the P type base layers 103 to the surface of the N⁻type epitaxial layer 102. This trench type back gate section 109 is formed by that an insulation material (oxide film) 111 is filled in a first trench 110.

P⁻type layers 112 are formed in the N⁻type epitaxial layer 102 at the right under position of the trench type back gate section 109, in the vertical direction. In FIG. 4, two P⁻type layers 112 are continuously formed in two different depths respectively in the vertical direction. The concentration of the P type impurity in the P⁻type layers 112 is different in the center part and the rim part, but the average concentration is about $3E15/cm^3$. In this, the concentration at the center part is on the order of $1E16/cm^3$ and the concentration at the rim part is on the order of $1E15/cm^3$.

Further, a P⁺type base layer 113 is formed in each of the P type base layers 103 at the position surrounding the trench type back gate section 109 and under each of the N⁺type source layers 104. The concentration of the P type impurity in the P⁺type base layer 113 is, for example, about $1E19/cm^3$. A dielectric interlayer 114 is formed on the whole surface. And a contact hole 115 is formed until the region contacting the P⁺type base layer 113 through the dielectric interlayer 114. A source electrode 116 is formed on the dielectric interlayer 114 and the contact hole 115, contacting the N⁺type source layer 104 and the P⁺type base layer 113. A drain electrode 117 is formed on the other surface of the N⁺type semiconductor substrate 101.

Figure 5:
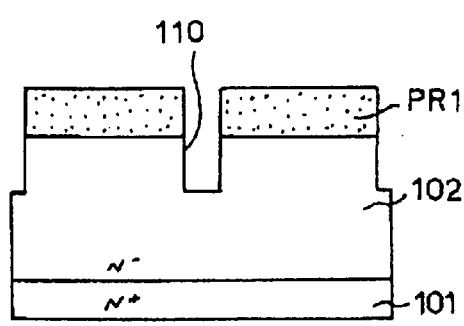
FIG. 5 is a diagram showing processes at the first half of a manufacturing method of the vertical type MOSFET at the first embodiment of the present invention.
Figure 5:
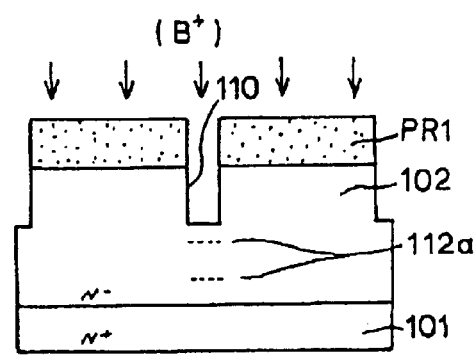
Figure 5:
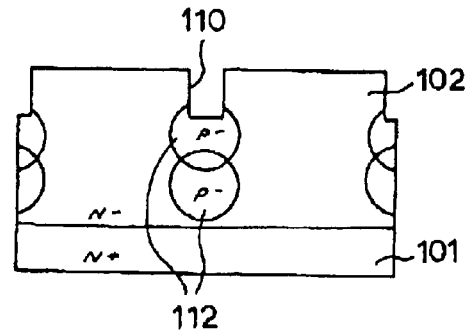
Figure 5:
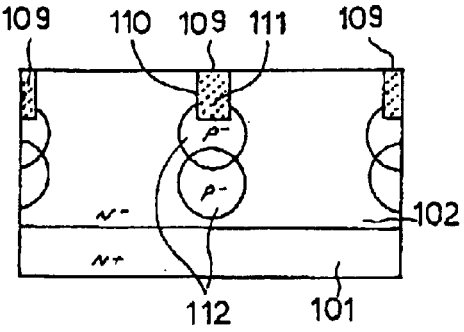

Next, referring to the drawings, a manufacturing method of the vertical type MOSFET at the first embodiment of the present invention is explained. FIG. 5 is a diagram showing processes at the first half of the manufacturing method of the vertical type MOSFET at the first embodiment of the present invention. Referring to FIG. 5, the processes at the first half are explained.

First, as shown in FIG. 5(a), the N⁻type epitaxial layer 102 being the high resistance drift layer is grown on one surface of the N⁺type semiconductor substrate 101 being the low resistance drift layer. A photo-resist is coated on the surface of the N⁻type epitaxial layer 102, and a resist pattern PR1, in which the region where the trench type back gate section 109 is formed later is opened, is formed. And the first trench 110 is formed by applying a selective etching to the N⁻type epitaxial layer 102 until a certain depth, by using the resist pattern PR1 as a mask.

Next, as shown in FIG. 5(b), a P type ion such as boron is implanted from the direction of the surface of the resist pattern PR1 with the incident angle 0° (the vertical direction), and ion implanted layers 112a are formed by that the ion implantation is selectively applied to the bottom of the first trench 110. At this time, depth positions, where ions are implanted, are plural by changing the strength of the energy of the ion implantation. At the first embodiment of the present invention, the depth positions where the ions are implanted are set to be two. When the ion is implanted by a higher energy, the ion can be implanted in a deeper position.

Next, as shown in FIG. 5(c), after removing the resist pattern PR1, the P type impurity is diffused in the two ion implanted layers 112a, whose depths are different each other, by applying a thermal process, and two P⁻type layers 112 are formed. In this, the P type impurity in each of the P⁻type layers 112 is diffused in the depth direction and the horizontal direction, and the two P⁻type layers 112 are connected and unified in the depth direction by this diffusion, and a unified P⁻type layer is formed.

Next, as shown in FIG. 5(d), an oxide film is grown with an enough thickness on the whole surface by a method such as the CVD (chemical vapor deposition) method, and the first trench 110 was filled with the oxide film. After this, the oxide film on the surface of the N⁻type epitaxial layer 102 is removed by applying an etching back process, and the oxide film in the first trench 110 remains. With this, the insulation material 111 made of the oxide film is formed, and the trench type back gate section 109 is formed.

Figure 6:
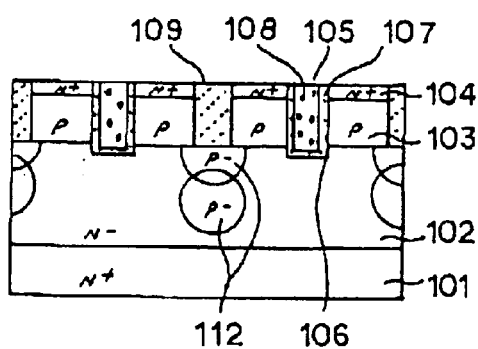
FIG. 6 is a diagram showing processes at the second half of the manufacturing method of the vertical type MOSFET at the first embodiment of the present invention.
Figure 6:
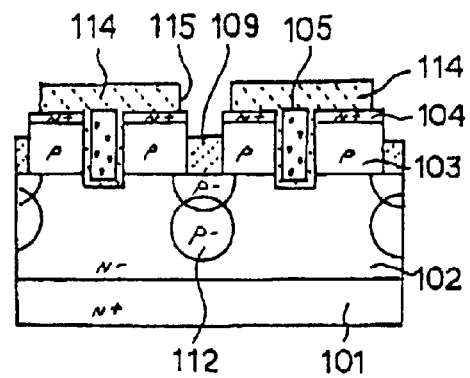
Figure 6:
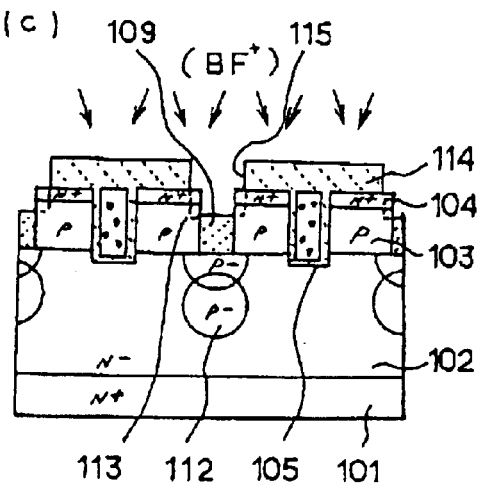
Figure 6:
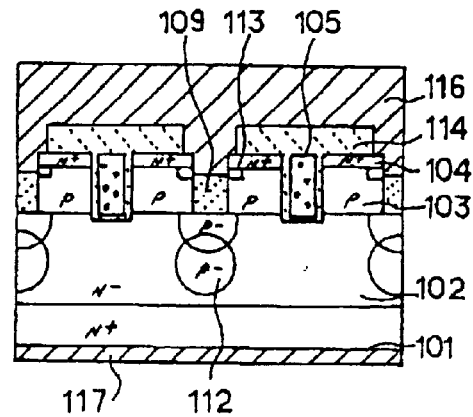

FIG. 6 is a diagram showing processes at the second half of the manufacturing method of the vertical type MOSFET at the first embodiment of the present invention. Referring to FIG. 6, the processes at the second half are explained.

First, as shown in FIG. 6(a), in the surface of the N⁻type epitaxial layer 102 at the position where the trench type back gate section 109 was formed, a P type impurity is implanted by ion implantation. And the P type base layers 103 are formed in the surface part of the N⁻type epitaxial layer 102 by activating the P type impurity (ions) by a thermal process. Further, in the surface of the formed P type base layers 103, an N type impurity is implanted by the ion implantation, and the N⁺type source layers 104 are formed by activating the N type impurity (ions) by the thermal process. The second trenches 106 are formed by applying etching to the N⁺type source layers 104 and the P type base layers 103, by forming a resist pattern by a photo resist (not shown). The gate insulation film 107 is formed on the inside surface of the second trench 106, and the gate poly-silicon 108 is filled in the second trench 106 having the gate insulation film 107. With this, each of the trench type gate electrodes 105 is formed by the second trench 106, the gate insulation film 107, and the gate poly-silicon 108.

Next, as shown in FIG. 6(b), on the surfaces of the N⁺type source layers 104, the trench type gate electrodes 105 and the trench type back gate section 109, the dielectric interlayer 114 made of such as an oxide film is formed. After this, the contact hole 115, whose opening part is slightly larger than the region of the trench type back gate section 109, is formed, by applying selective etching to the dielectric interlayer 114 by making a resist pattern, which a photo resist (not shown) is patterned, as a mask. At the time of this etching, the surface part of the insulation material (oxide film) 111, which is embedded in the first trench 110, is etched so that a part of the P type base layer 103 disposing under the N⁺type source layer 104 is exposed in the first trench 110.

Next, as shown in FIG. 6(c), in order to have an ohmic contact between the source electrode 116 and the P type base layer 103, a P type impurity such as boron fluoride is implanted in the contact hole 115 by an oblique rotation implanting method, by making the dielectric interlayer 114 as a mask for the N⁺type source layers 104. And the P⁺type base layer 113 is formed in the P type base layer 103, at the position surrounding the first trench 110 under the N⁺type source layer 104, by applying a thermal process for the activation of the P type impurity.

After this, as shown in FIG. 6(d), a metal layer made of such as Al (aluminum) is formed on the dielectric interlayer 114 and the trench type back gate section 109 by a spattering method. By this metal layer, the source electrode 116, which is connected to the N⁺type source layer 104 and the P⁺type base layer 113 through the contact hole 115 formed in the dielectric interlayer 114, is formed. And the drain electrode 117 is formed by forming a metal layer on the other surface of the N+type semiconductor substrate 101. With the processes mentioned above, the vertical type MOSFET shown in FIG. 4 is manufactured.

As mentioned above, according to the vertical type MOSFET at the first embodiment of the present invention, the electric field distribution of the P−type layers 112, which extend in the depth direction right under the trench type back gate section 109, becomes the one shown in the left side of FIG. 4.

By the existence of the P−type layers 112, when a voltage is applied between the source electrode 116 and the drain electrode 117, a depletion layer occurs not only in the vertical direction between the P type base layers 103 and the N−type epitaxial layer (high resistance drift layer) 102, but also in the horizontal direction between the P−type layers 112 positioned right under the trench type back gate section 109 and the N−type epitaxial layer (high resistance drift layer) 102. With this depletion layer, the centralization of the electric field, which is one of the causes of lowering the breakdown voltage between the source electrode 116 and the drain electrode 117, is lessened.

Moreover, according to the vertical type MOSFET at the first embodiment of the present invention, the P−type layers 112 are formed right under the trench type back gate section 109. Therefore, when it is compared with a conventional vertical type MOSFET, in which a trench type back gate section and P−type layers are not formed, even by using the high resistance drift layer having the same concentration of the impurity, the breakdown voltage can be made to be higher at the present invention. Further, even the breakdown voltage is the same, the concentration of the impurity of the high resistance drift layer 102 can be set to be high, and the drift resistance can be decreased.

Furthermore, according to the vertical type MOSFET at the first embodiment of the present invention, the trench type back gate section 109 is formed by that the insulation material 111 is filled in the first trench 110. With this structure, when a voltage is applied between the source electrode 116 and the drain electrode 117, lowering the breakdown voltage, caused by a reach through phenomenon of the depletion layer, which the depletion layer in the P−type layers 112 right under the trench type back gate section 109 and the P type base layer 103 extends to the source electrode 116, can be prevented.

At the vertical type MOSFET at the first embodiment of the present invention, its drift resistance is made to be low without lowering the breakdown voltage between source and drain electrodes at about 150 V being the middle class breakdown voltage.

As mentioned above, according to the manufacturing method of the vertical type MOSFET at the first embodiment of the present invention, the P−type layers 112 are formed in the N−type epitaxial layer (high resistance drift layer) 102, by implanting ions of an impurity from the bottom of the first trench 110. Further, each of plural P−type layers 112, which are placed in a line in the depth direction of the N−type epitaxial layer (high resistance drift layer) 102, can be placed in an arbitrary depth, by changing the strength of the energy of the ion implantation. However, at the conventional technologies, the high resistance drift layer is formed by stacking layers, or the P−type epitaxial layer is formed by using a selective etching method and a selective epitaxial growing method. Therefore, when it is compared with the conventional technologies, the manufacturing method of the vertical type MOSFET at the first embodiment of the present invention becomes easy.

At the manufacturing method of the vertical type MOSFET at the first embodiment of the present invention, in the processes shown in FIG. 5(a), when the first trench 110 is formed by using the selective etching, a nitride film and an oxide film are used as the mask material, and after this, the right angle parts of the first trench 110 are rounded by applying thermal oxidation. With these processes, the process filling the insulation material 111 in the first trench 110 can be improved. Further, the occurrence of the centralization of the electric field at the time when a voltage is applied between the source electrode 116 and the drain electrode 117 can be lessened by eliminating the right angle parts.

Figure 7:
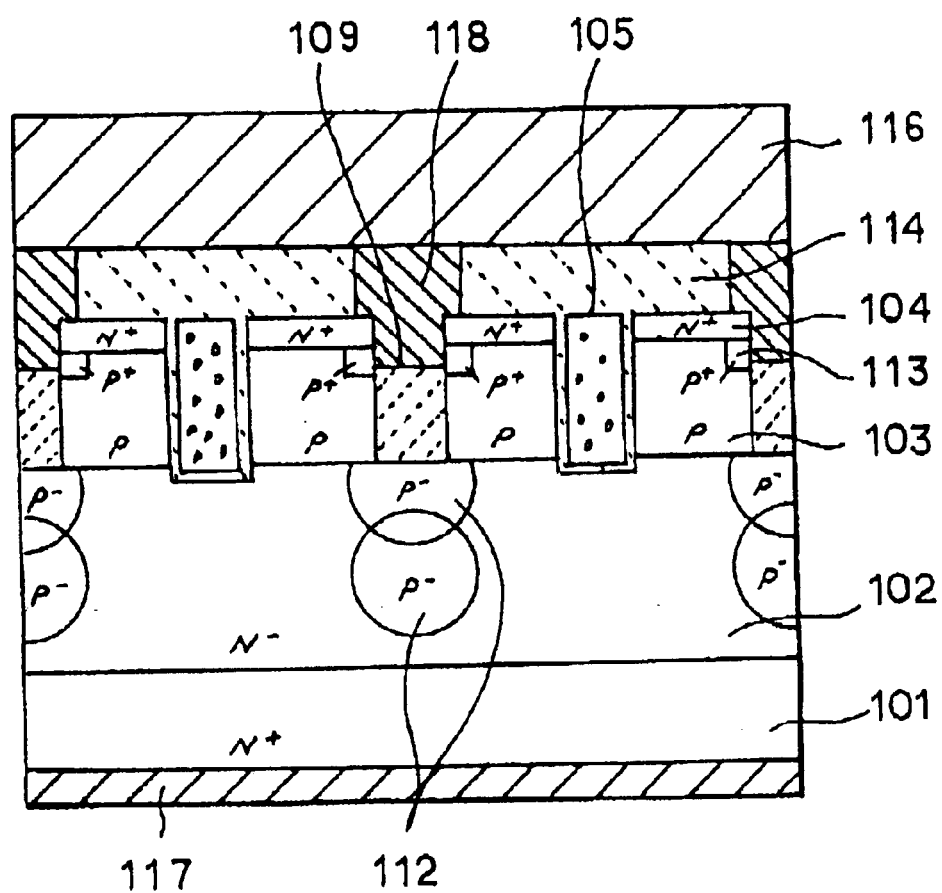
FIG. 7 is a sectional view showing the structure of a vertical type MOSFET at a modified example of the first embodiment of the present invention.

FIG. 7 is a sectional view showing the structure of a vertical type MOSFET at a modified example of the first embodiment of the present invention. At the first embodiment of the present invention, as shown in FIG. 6(d), a metal layer made of such as aluminum is formed on the dielectric interlayer 114 and the trench type back gate section 109 by a spattering method. And the source electrode 116 was formed by this metal layer. At the modified example of the first embodiment of the present invention, as shown in FIG. 7, a metal 118 such as W (tungsten) is filled in the contact hole 115 in the dielectric interlayer 114, after this, the source electrode 116 made of aluminum is formed. With these processes, it is possible that the surface of the source electrode 116 is flattened. When the W is filled in the contact hole 115, for example, first a W film is grown on the whole surface, and after this, the surface of the W film is flattened by using the CMP (chemical mechanical polishing) method. This method can be used to flatten the surface.

At the first embodiment of the present invention, the ion implantation to grow the $P^{31}$ type layers 112 is executed at the two positions whose depths are different each other, however, an additional $P^{31}$ type layer 112 can be formed at the deeper position in the N−type epitaxial layer (high resistance drift layer) 102 by using a stronger energy of the ion implantation. That is, two or more P−type layers 112 can be formed in the N−type epitaxial layer (high resistance drift layer) 102 by changing the strength of the energy of the ion implantation.

Figure 8:
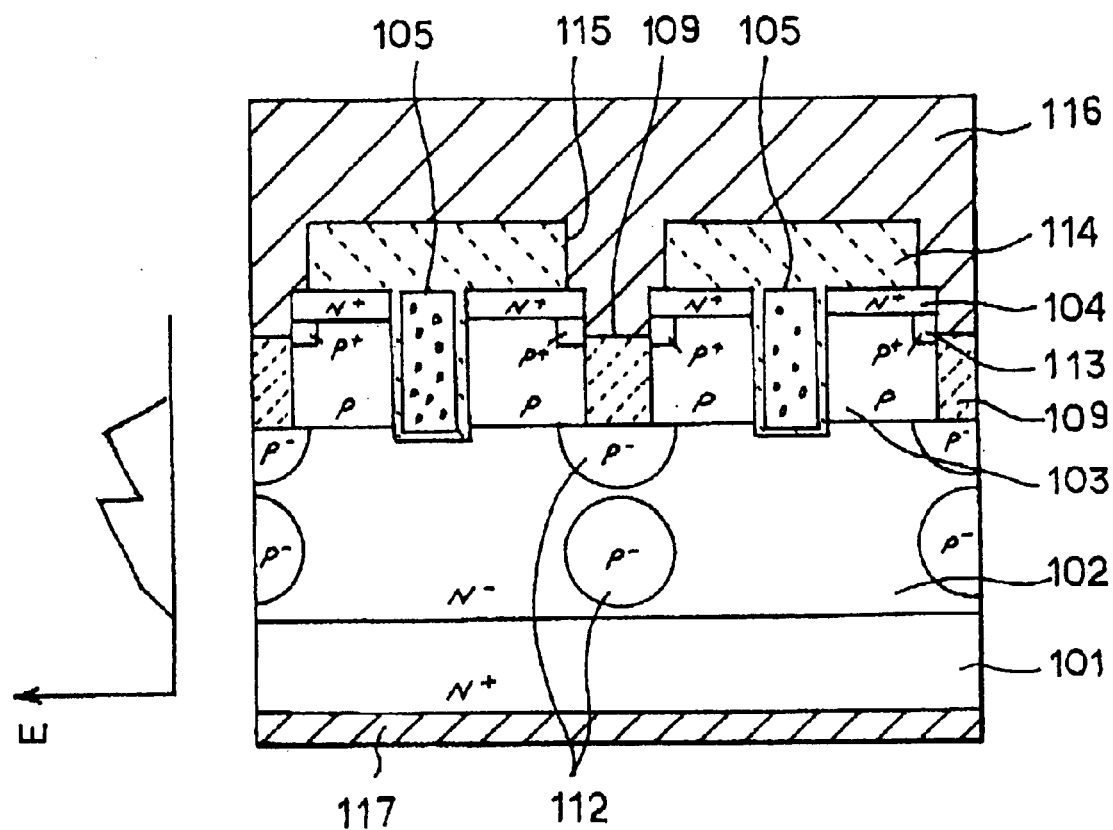
FIG. 8 is a sectional view showing the structure of a vertical type MOSFET at a second embodiment of the present invention.

Next, referring to the drawing, a vertical type MOSFET at a second embodiment of the present invention is explained. FIG. 8 is a sectional view showing the structure of the vertical type MOSFET at the second embodiment of the present invention. At the second embodiment, each of the parts, which is equivalent to one of the parts at the first embodiment, has the same reference number.

As shown in FIG. 8, an N−type epitaxial layer 102 being a high resistance drift layer is formed on one surface of an N+type semiconductor substrate 101 being a low resistance drift layer. P type base layers 103 and N+type source layers 104 are layered in the N−type epitaxial layer 102. Trench type gate electrodes 105 are formed from the surface of each of the N+type source layers 104 to the N−type epitaxial layer 102. In the region between the two trench type gate electrodes 105, a trench type back gate section 109 is formed from the position being deeper than the surface of the P type base layer 103 to the N−type epitaxial layer 102. This trench type back gate section 109 is formed by that an insulation material 111 is filled inside a first trench 110.

Two P−type layers 112 are formed in the right under positions of the trench type back gate section 109 in the N−type epitaxial layer 102, in the vertical direction in a state that the position of each of the two P−type layers 112 is separated. Further, a P+type base layer 113 is formed in the P type base layer 103 at the position surrounding the trench type back gate section 109 and under the N⁺type source layer 104. A dielectric interlayer 114 is formed on the whole surface, and a contact hole 115 is formed until the region contacting the P⁺type base layer 113 through the dielectric interlayer 114. A source electrode 116 is formed in the contact hole 115, contacting the N⁺type source layer 104 and the P⁺type base layer 113. A drain electrode 117 is formed on the other surface of the N⁺type semiconductor substrate 101.

At the vertical type MOSFET at the second embodiment of the present invention, the concentration of the impurities is the same at the first embodiment.

The manufacturing method of the vertical type MOSFET at the second embodiment of the present invention is almost the same at the first embodiment. However, at the process shown in FIG. 5(b) in the first embodiment of the present invention, when each of the P⁻type layers 112 is formed, the difference of the strength of the energy of the ion implantation for forming each of the P⁻type layers 112 is made to be large. With this, the difference of the depth between the P⁻type layers 112 is made to be large, and when the implanted ions are activated, each of the P⁻type layers 112 is positioned at the depth separated each other.

At the vertical type MOSFET at the second embodiment of the present invention, the electric field distribution of the two P⁻type layers 112, which extend in the depth direction right under the trench type back gate section 109, becomes the one shown in the left side of FIG. 8.

At the vertical type MOSFET at the second embodiment of the present invention, even in case that each of the two P⁻type layers 112 is formed separately in the depth direction, almost the same effect at the first embodiment can be obtained. That is, by the existence of the P⁻type layers 112 right under the trench type back gate section 109, when a voltage is applied between the source electrode 116 and the drain electrode 117, a depletion layer occurs not only in the vertical direction between the P type base layer 103 and the N⁻type epitaxial layer (high resistance drift layer) 102, but also in the horizontal direction between the P⁻type layers 112 and the N⁻type epitaxial layer (high resistance drift layer) 102. With this depletion layer, the centralization of the electric field, which is one of the causes of lowering the breakdown voltage between the source and drain electrodes, is lessened, and the breakdown voltage at the high resistance drift layer 102 can be increased. Further, even at the same breakdown voltage as at the conventional vertical type MOSFET, the concentration of the impurity of the high resistance drift layer 102 can be set to be higher, and the drift resistance can be decreased.

Moreover, the trench type back gate section 109 is formed by that the insulation material 111 is filled in the first trench 110. With this structure, when a voltage is applied between the source electrode 116 and the drain electrode 117, lowering the breakdown voltage, caused by a reach through phenomenon of the depletion layer, which the depletion layer in the P⁻type layers 112 right under the trench type back gate section 109 and the P type base layer 103 extends to the source electrode 116, can be prevented.

Furthermore, at the vertical type MOSFET at the second embodiment of the present invention, the degree of freedom at setting the strength of the energy of the ion implantation to each of the P⁻type layers 112 can be large, and the manufacturing the vertical type MOSFET can be easier.

Figure 9:
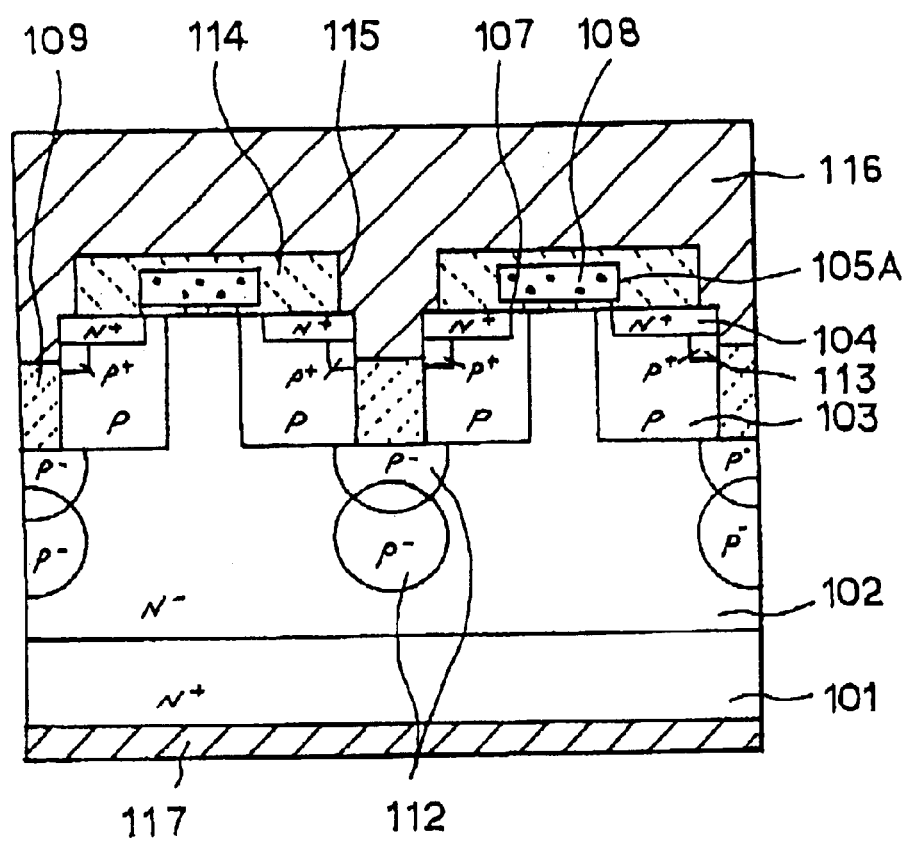
FIG. 9 is a sectional view showing the structure of a vertical type MOSFET at a third embodiment of the present invention.

Next, referring to the drawing, a vertical type MOSFET at a third embodiment of the present invention is explained. FIG. 9 is a sectional view showing the structure of the vertical type MOSFET at the third embodiment of the present invention. At the third embodiment, each of the parts, which is equivalent to one of the parts at the first embodiment, has the same reference number. At the third embodiment, a planar type gate electrode is used instead of using the trench type gate electrode at the first and second embodiments.

As shown in FIG. 9, an N⁻type epitaxial layer 102 being a high resistance drift layer is formed on one surface of an N⁺type semiconductor substrate 101 being a low resistance drift layer. Each of P type base layers 103 is formed in the N⁻type epitaxial layer 102 with an island shape. In the surface of each of the P type base layers 103, an N⁺type source layer 104 is formed. A trench type back gate section 109 is formed through the N⁺type source layer 104 and the P type base layer 103 until the N⁻type epitaxial layer 102. A P⁺type base layer 113 is formed in the P type base layer 103 at the position surrounding the trench type back gate section 109 and under the N⁺type source layer 104. This trench type back gate section 109 is formed by that an insulation material 111 is filled in a first trench 110.

Two P⁻type layers 112 are formed in the right under position of the trench type back gate section 109 in the N⁻type epitaxial layer 102, in the vertical direction in a state that the position of each of the two P⁻type layers 112 is connected. A gate insulation film 107 and a gate poly-silicon 108 are formed on the N⁻type epitaxial layer 102 at the position between the P type base layers 103, and this gate poly-silicon 108 becomes a planar type gate electrode 105A.

Further, a dielectric interlayer 114 is formed on the whole surface. And a contact hole 115 is formed until the region contacting the P⁺type base layer 113 through the dielectric interlayer 114 at the right upper position of the trench type back gate section 109. A source electrode 116 is formed in the contact hole 115 and on the dielectric interlayer 114, contacting the N⁺type source layer 104 and the P⁺type base layer 113. A drain electrode 117 is formed on the other surface of the N⁺type semiconductor substrate 101.

At the third embodiment of the present invention, the concentration of the impurities is the same at the first embodiment.

At the third embodiment of the present invention, the planar type gate electrode 105A was used instead of using the trench type gate electrode 105 at the first and second embodiments. Therefore, the manufacturing method is slightly different from that at the first embodiment. However, almost the same effect at the first embodiment can be obtained. That is, by the existence of the P⁻type layers 112 right under the trench type back gate section 109, when a voltage is applied between the source electrode 16 and the drain electrode 117, a depletion layer occurs not only in the vertical direction between the P type base layer 103 and the N⁻type epitaxial layer (high resistance drift layer) 102, but also in the horizontal direction between the P⁻type layers 112 and the N⁻type epitaxial layer (high resistance drift layer) 102. With this depletion layer, the centralization of the electric field, which is one of the causes of lowering the breakdown voltage between the source and drain electrodes, is lessened, and the breakdown voltage at the high resistance drift layer 102 can be increased. Further, even at the same breakdown voltage as at the conventional vertical type MOSFET, the concentration of the impurity of the high resistance drift layer 102 can be set to be higher, and the drift resistance can be decreased.

Moreover, the trench type back gate section 109 is formed by that the insulation material 111 is filled in the first trench 110. With this structure, when a voltage is applied between the source electrode 116 and the drain electrode 117, lowering the breakdown voltage, caused by a reach through phenomenon of the depletion layer, which the depletion layer in the P⁻type layers 112 right under the trench type back gate section 109 and the P type base layer 103 extends to the source electrode 116, can be prevented.

Furthermore, at the vertical MOSFET at the third embodiment of the present invention, it is not necessary that the second trench 106 and the gate insulation film 107 are formed and the gate poly-silicon 108 is filled in the second trench 106 for forming the trench type gate electrode 105 at the first and second embodiments. Therefore, its manufacturing method can be executed easily.

At the vertical MOSFET at the third embodiment of the present invention, the P⁻type layers 112 right under the trench type back gate section 109 can be positioned separately from each other as the same as at the second embodiment.

Further, at the second and third embodiments, the surface of the vertical type MOSFET can be flattened by filling the metal 118 in the contact hole 115, as the same as at the modified example of the first embodiment shown in FIG. 7.

The vertical type MOSFET at the embodiments of the present invention can be a conductivity type or an opposite conductivity type.

As mentioned above, according to the vertical type MOSFET at the embodiments of the present invention, impurity layers, which are an opposite conductivity type to a high resistance drift layer, exist under a trench type back gate section, extending in the depth direction. Therefore, when a voltage is applied between source and drain electrodes, a depletion layer occurs not only in the vertical direction between a base layer and the high resistance drift layer, but also in the horizontal direction between the impurity layers positioned right under the trench type back gate section and the high resistance drift layer. With this depletion layer, the centralization of the electric field, which is one of the causes of lowering the breakdown voltage between the source and drain electrodes, is lessened, and the breakdown voltage can be increased, and the concentration of the impurity of the high resistance drift layer can be set to be high, and the drift resistance can be decreased.

Moreover, according to the vertical type MOSFET at the embodiments of the present invention, the trench type back gate section is formed by that an insulation material is filled in a trench. With this structure, when a voltage is applied between the source and drain electrodes, lowering the breakdown voltage, caused by a reach through phenomenon of the depletion layer, which the depletion layer in the impurity layers right under the trench type back gate section and in the base layer extends to the source electrode, can be prevented.

Furthermore, according to the manufacturing method of the vertical type MOSFET at the embodiments of the present invention, plural impurity layers, which are the opposite conductivity type to the high resistance drift layer, can be formed in the high resistance drift layer, by implanting ions of an impurity from the bottom of the trench. Further, each of the plural impurity layers, which are placed in a line in the depth direction of the high resistance drift layer, can be placed in an arbitrary depth, by changing the strength of the energy of the ion implantation. Therefore, when the manufacturing method of the present invention is compared with the conventional technologies, in which the high resistance drift layer is formed by stacking layers, or the vertical type MOSFET is formed by using a selective etching method and a selective epitaxial growing method, the manufacturing method of the present invention becomes easy.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A vertical type MOSFET, comprising:

a substrate of a first conductivity type;

a high resistance drift layer of said first conductivity type on said substrate;

plural base layers of an opposite second conductivity type on a surface of said high resistance drift layer;

plural source layers of said first conductivity type on said base layers;

plural gate electrodes on said surface of said high resistance drift layer;

an insulative trench type back gate section in a first trench between said plural gate electrodes; and an impurity layer of said second conductivity type, in said high resistance drift layer directly under said trench type back gate section.

2. A vertical type MOSFET in accordance with claim 1, wherein said impurity layer consists of plural impurity layers that are at different depths and are connected in the depth direction.

3. The vertical type MOSFET in accordance with claim 1, wherein said impurity layer consists of plural impurity layers that are at different depths and are separated in the depth direction.

4. The vertical type MOSFET in accordance with claim 1, wherein each of said plural gate electrodes is a trench type gate electrode in which a gate insulation film was formed on a second trench formed through one of said source layers and one of said base layers.

5. The vertical type MOSFET in accordance with claim 1, wherein each of said plural gate electrodes is a planar type gate electrode of a conductive material on a gate insulation film, said gate insulation film being on one of said plural source layers and a part of one of said plural base layers and a part of said high resistance drift layer.

6. The vertical type MOSFET in accordance with claim 1, wherein a dielectric interlayer is formed on said plural source layers and said plural gate electrodes and said trench type back gate section, and a source electrode connecting to one of said source layers and one of said plural base layers is formed through a contact hole opened in said dielectric interlayer.

7. The vertical type MOSFET in accordance with claim 6, wherein conductive material being different from a conductive material of said source electrode is filled in said contact hole.

8. A manufacturing method of a vertical type MOSFET, comprising the steps of:

forming a high resistance drift layer of a first conductivity type of a substrate of said first conductivity type;

forming plural base layers of an opposite second conductivity type on a surface of said high resistance drift layer;

forming plural source layers of said first conductivity type in said plural base layers;

forming plural gate electrodes in said plural source layers and said plural base layers reaching to said high resistance drift layer via an insulation film;

forming a trench between said plural gate electrodes in said high resistance drift layer;

forming plural impurity layers of said second conductivity type in said high resistance drift layer directly under said trench by implanting ions of said second conductivity type at a bottom of said trench; and filling a insulation material in said trench.

9. The manufacturing method of a vertical type MOSFET in accordance with claim 8, wherein each of said plural impurity layers is formed in a respective different depth in said high resistance drift layer by plural ion implantation.

* * * * *